US011622063B2

(12) United States Patent
Schieltz (10) Patent No.: US 11,622,063 B2
(45) Date of Patent: Apr. 4, 2023

(54) CAMERA HOUSING COMPRISING MOVABLE THERMAL BRIDGE FOR TEMPERATURE REGULATION

(71) Applicant: Johnson Controls Tyco IP Holdings LLP, Milwaukee, WI (US)

(72) Inventor: Steven W. Schieltz, Boca Raton, FL (US)

(73) Assignee: JOHNSON CONTROLS TYCO PP HOLDINGS LLP, Milwaukee, WI (US)

( * ) Notice: Subject to any disclaimer, the term of this patent is extended or adjusted under 35 U.S.C. 154(b) by 14 days.

(21) Appl. No.: 16/788,043

(22) Filed: Feb. 11, 2020

(65) Prior Publication Data

US 2021/0250482 A1  Aug. 12, 2021

(51) Int. Cl.
*H04N 5/225* (2006.01)
*G03B 17/55* (2021.01)
(Continued)

(52) U.S. Cl.
CPC ......... *H04N 5/22521* (2018.08); *G03B 17/55* (2013.01); *H04N 5/2252* (2013.01); *H04N 5/2253* (2013.01); *H04N 5/2257* (2013.01); *H05K 1/0203* (2013.01); *H05K 7/2049* (2013.01); *F28F 2255/04* (2013.01); *G01K 1/24* (2013.01); *G02B 7/028* (2013.01); *G05D 23/08* (2013.01); *G05D 23/1854* (2013.01); *G12B 1/02* (2013.01); *H01L 31/024* (2013.01)

(58) Field of Classification Search
CPC ............. H04N 5/22521; H04N 5/2252; H04N 5/2253; H04N 5/2251; H04N 5/2254; H04N 5/2257; H04N 5/2258; H04N 5/2259; G03B 17/55; G03B 2217/002; H05K 7/2049; H05K 1/0201–021; H05K 7/20; H05K 7/2039; H05K 7/20436; G06F 1/1686; G06F 1/20; G06F 1/203; G06F 1/206; H01L 27/14618; H01L 27/14634; G01K 1/20; G01K 1/24; G05D 23/00; G05D 23/08; G05D 23/1854; G05D 23/2754; G12B 1/02; G12B 7/00; G12B 15/06; G02B 7/028; G08B 13/19617–19621; F28F 2013/008; F28F 2255/04

See application file for complete search history.

(56) References Cited

U.S. PATENT DOCUMENTS 6,278,607 B1 * 8/2001 Moore ................ G06F 1/203
361/709
6,459,855 B1 * 10/2002 Kosaka ................ G03B 9/08
396/443

(Continued)

FOREIGN PATENT DOCUMENTS

EP  3079348 A1 * 10/2016 .......... H04N 5/2252
JP  2000274976  * 10/2000 ............. F25B 21/02

*Primary Examiner* — Twyler L Haskins
*Assistant Examiner* — Akshay Trehan
(74) *Attorney, Agent, or Firm* — ArentFox Schiff LLP (57) ABSTRACT

Example implementations include a camera and a thermal management apparatus for a camera including an outer housing walls, an inner bracket for mounting a camera component. The camera and thermal management apparatus further includes a thermal bridge assembly for selectively increasing a thermal conductivity between the inner bracket and the outer housing walls.

14 Claims, 4 Drawing Sheets

(51) Int. Cl.
*H05K 7/20* (2006.01)
*H05K 1/02* (2006.01)
*H01L 31/024* (2014.01)
*G01K 1/24* (2006.01)
*G12B 1/02* (2006.01)
*G05D 23/08* (2006.01)
*G05D 23/185* (2006.01)
*G02B 7/02* (2021.01)

(56) References Cited

U.S. PATENT DOCUMENTS

| | | | |
|---|---|---|---|
| 8,503,494 B2 * | 8/2013 | Yee | G05D 23/192 |
| | | | 372/36 |
| 10,806,054 B1 * | 10/2020 | Mahalingam | H05K 7/20454 |
| 2012/0257646 A1 * | 10/2012 | Yee | G05D 23/192 |
| | | | 372/36 |
| 2014/0137570 A1 * | 5/2014 | Hauck | H01L 35/30 |
| | | | 62/3.2 |
| 2017/0164510 A1 * | 6/2017 | Bucher | H05K 7/20 |
| 2018/0305043 A1 * | 10/2018 | Mindock | B64G 1/506 |
| 2019/0110366 A1 * | 4/2019 | Gavagnin | H05K 1/09 |
| 2019/0154949 A1 * | 5/2019 | Hosoe | H04N 5/232 |
| 2021/0112315 A1 * | 4/2021 | Mays | H04Q 1/035 |
| 2021/0195076 A1 * | 6/2021 | Chen | G03B 30/00 |

* cited by examiner

CAMERA HOUSING COMPRISING MOVABLE THERMAL BRIDGE FOR TEMPERATURE REGULATION

TECHNICAL FIELD

The described aspects relate to a camera or camera housing, and more particularly to a camera or camera housing with temperature regulating features.

BACKGROUND

Video based camera systems providing video surveillance and data are in common use and may comprise a single or multiple cameras to provide adequate video coverage of a prescribed area. Multiple cameras may be viewed by security staff in control rooms and/or the camera system may provide a data feed that is constantly or intermittently recorded and stored to be viewed at a later time if necessary. Video based camera systems may also provide data for analysis by either security staff or other monitoring employees and/or may provide data for analysis by a computer. For example, Artificial Intelligence ("AI") based monitoring may provide analysis of consumer or foot traffic, vehicle traffic, or may provide monitoring or detection of a specific person or customer.

Cameras for use in video based surveillance systems may be subject to a wide range of environments which may have adverse effects on camera sensor performance. Thus, improvements in camera performance in a wide range of environmental conditions are desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

An example implementation includes a thermal management apparatus for a camera including outer housing walls and an inner bracket for mounting a camera component. The thermal management apparatus further includes a thermal bridge assembly for selectively increasing a thermal conductivity between the inner bracket and the outer housing walls.

Another example implementation includes a camera with an imaging sensor and including an outer housing walls, an inner bracket for mounting the imaging sensor. The camera further includes a thermal bridge assembly for selectively increasing or selectively decreasing a thermal conductivity between the inner bracket and the outer housing walls.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Aspects of the present disclosure relate to a camera and camera housing configured to regulate the temperature and/or humidity outside of and/or within the camera housing by dynamically controlling thermal conduction between the housing and internal components of the camera. Thus, by implementing the concepts disclosed in further detail below, the operating temperature and internal environment of the camera and camera components may be maintained within a desirable range.

The following includes definitions of selected terms employed herein. The definitions include various examples and/or forms of components that fall within the scope of a term and that may be used for implementation. The examples are not intended to be limiting. Further, it will be obvious to one skilled in the art that the present invention may be practiced without these specific details.

For purposes of the disclosure, directional terms are expressed generally with relation to a standard frame of reference when the system and apparatus described herein is installed and in an in-use orientation.

Throughout the disclosure, the term substantially may be used as a modifier for a geometric relationship between elements or for the shape of an element or component. While the term substantially is not limited to a specific variation and may cover any variation that is understood by one of ordinary skill in the art to be an acceptable variation, some examples are provided as follows. In one example, the term substantially may include a variation of less than 10% of the dimension of the object or component. In another example, the term substantially may include a variation of less than 5% of the object or component. If substantially is used to define the angular relationship of one element to another element, one non-limiting example of the term substantially may include a variation of 5 degrees or less. These examples are not intended to be limiting and may be increased or decreased based on the understanding of acceptable limits to one of skill in the relevant art.

The term camera may be used throughout the specification and is not intended to be limited to any specific type of camera. A camera, may for example include an image sensor or an imager capable of detecting by converting variable attenuation of light or other electromagnetic radiation into signals, e.g., current and the associated circuitry related to operation of the image sensor or the imager. Some examples of image sensors or imagers usable with the current disclosure include but are not limited to charge-coupled device ("CCD") sensors, active-pixel sensor ("CMOS") or hybrid CCD/CMOS sensors. While one example implementation of the disclosure is related to regulation of the environment within a camera, the current disclosure is applicable to any type of electronic component enclosed or at least partially enclosed within a housing that may benefit from dynamic control of thermal conduction with internal components of the housing with the external walls or other exposed portions of the housing.

The following serves as a broad overview of the current disclosure and the problems the disclosed concepts aim to solve. Further detail of aspects of the disclosure are described with reference to the drawings below. The following overview is intended merely to provide context and is not intended to limit the breadth of the disclosure or claims in any way. Video cameras or other imaging equipment may be enclosed in housings. The housings containing video cameras or other imaging equipment are often installed in different environments and are thus subjected to a wide range of ambient temperatures. While some environments are climate controlled (e.g., department stores), many environments exhibit large swings in temperature. For example, video cameras that are installed in factories, parking lots, or other outdoor areas can be exposed to temperatures that range widely.

Additionally, imaging equipment components may generate a significant amount of heat during operation. For example, microprocessors, image sensors or imagers, video processors, and external and/or integrated memory generate heat during operation. Other components such as video compression circuits or chips, power controllers, or infrared illuminators will also produce heat during operation. The combination of the external ambient temperatures of areas surrounding video cameras and the heat generated by the components of the video cameras governs the operating temperatures of the imaging equipment components.

Imaging equipment components may have high temperature specifications, which are typically set by manufacturers of the components and specify maximum operating temperatures of the components. Exceeding the high temperature specifications may cause the components to work incorrectly or even fail. Additionally, allowing the components to exceed the high temperature specifications for extended periods of time may reduce their operating lifetimes.

In the past, providing cameras capable of performing in a satisfactory manner above and below the operating temperature ranges of conventional internal components of the camera required providing components that have a wider operating temperature range, at an increased cost.

The system of the current disclosure provides a dynamic system to control thermal conduction between the outer housing walls and the internal components of the camera system. One implementation of a thermal conduction management system in accordance with an aspect of the disclosure may include a thermal bridge assembly for selectively increasing or decreasing the thermal conductivity between the outer housing walls and the inner components and/or a mounting system for inner components. By selectively increasing or decreasing the thermal conductivity between the outer housing walls and the components, the internal temperature and/or environment (e.g., humidity) of the camera system may be controlled so as to fall within an optimal range.

Various aspects are now described with reference to the drawings. In the following description, for purposes of explanation, numerous specific details are set forth in order to provide a thorough understanding of one or more aspects. It may be evident, however, that such aspect(s) may be practiced without these specific details. Further, in some cases, methods, procedures, and components that are well-known or methods that would have been understood by one of skill in the art are described generally and without specific so as to not unnecessarily obscure aspects of the present disclosure.

Figure 1:
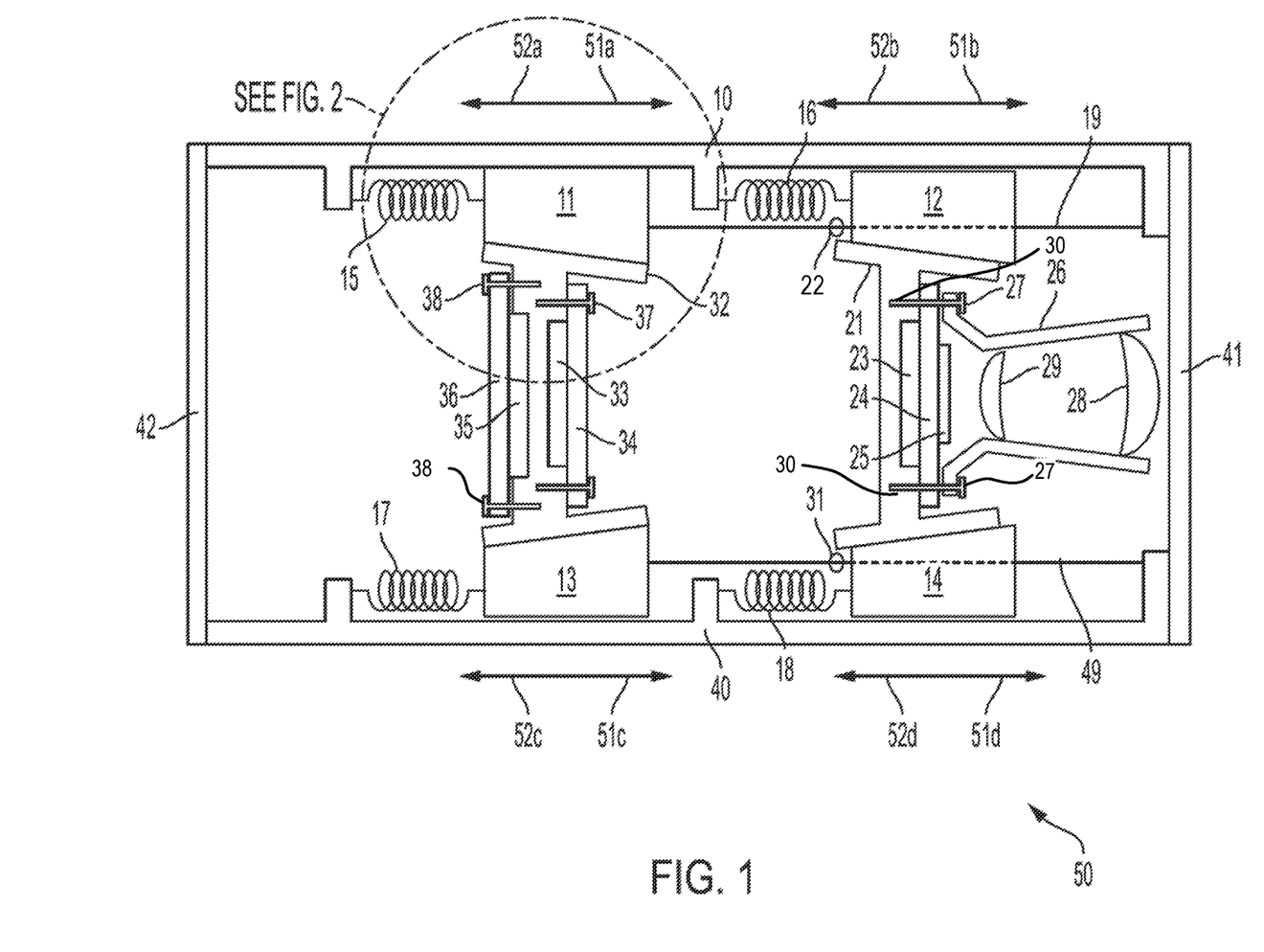
FIG. 1 is a diagram of an example top view of a temperature regulating camera housing and camera, according to the described aspects of the present disclosure.

Referring to FIG. 1, an example camera system and housing is shown. The camera system 50 may include outer housing walls having walls 40, 41, 42, and 10. The housing may include a top and bottom wall (not shown). The outer housing walls may for example be formed of a metallic or non-metallic material. In one example, the housing may include steel or aluminum. The housing may be configured to be air and/or water tight or resistant. Wall 41 of the housing may for example include a lens or clear portion allowing light to pass therethrough. The housing may additionally be configured to be opened by a technician or user to allow for servicing and/or replacement of the components therein.

The aforementioned housing may be configured to contain necessary optics, image sensor(s) and/or circuitry for recording still images and/or video. For example, the housing may contain an image sensor 25, which may be coupled with, connected to or mounted on image sensor circuit board 24. The image sensor circuit board 24 and/or image sensor 25 may be coupled with, connected to or mounted on to a first bracket 21. The first bracket 21 may include mounting portions 30 for receiving the image sensor circuit board 24 and/or the image sensor 25 mounting provision 27. In one example, the mounting provision may include a threaded hole 30 for receiving a threaded fastener 27 or series of fasteners configured to be threaded into the respective threaded openings 30 in the first bracket 21. The first bracket 21 and second bracket 32 may be stationarily mounted with relation to the housing outer walls 10, 40, 41, and 42 by any method known in the art. For example, the first bracket 21 and second bracket 32 may be mounted to the housing top and/or bottom walls (not shown in FIG. 1). The first bracket 21 and second bracket 32 may for example be fastened to the housing top wall and/or bottom wall via welding, gluing, and/or any known fastener system. In addition, the first bracket and/or second bracket may be formed integrally with the top wall and/or bottom wall. The first bracket 21 may also have optics mounted thereto, which may include a lens mount 26, a front lens 28 and rear lens element 29. In one example, the lens mount 26 may be mounted to the first bracket 21 via the aforementioned mounting provisions 27. The lens mount 26 may further include a mechanism (not shown) for increasing or decreasing the focal length by moving either one of or both of the front lens elements 28 or the rear lens element 29 forwards or backwards (e.g., in directions 51*d* and 52*d* respectively). Such mechanisms are known and commonly used in the art and thus further detail of such a mechanism is not provided here. In addition, the image sensor circuit board 24 may have a thermal conduction backing 23, that may for example be thermal conduction foam or any material that enhances the thermal conductivity between image sensor circuit board 24 and the first bracket 21.

The camera system 50, may further include a second bracket 32. The second bracket 32 may be configured to have circuitry or circuit boards mounted thereto. For example, the second bracket may have a front circuit board 34 and a rear circuit board 36 mounted to respective front surface and rear surface of the second bracket 32. The front circuit board 34 and rear circuit board 36 may be in signal communication with the image sensor 25, e.g., via a ribbon cable (not shown), and contain circuitry for acquiring images and and/or video data from sensor 25. In one example, the front circuit board 34 and/or the rear circuit board 36 may contain power supply components, e.g., an AC to DC converter, a DC to DC converter and/or a control unit and/or a processor or multiple processors, to name a few examples. However, the front circuit board 34 and/or rear circuit board 36 may contain any components or features known in the art that may be necessary for operation of a camera system. In addition, either one of or both of the front and/or rear circuit boards 34 and 36 may have a thermal conduction backing 33 and 35 respectively, which may be comprised of a thermal conductive foam or any material that enhances the thermal conductivity between the front and/or rear circuit boards 34 and 36 and the second bracket 32.

In one example, the front circuit board 34 and the rear circuit board 36 may contain circuits that are configured to perform optimally within a certain temperature range. For example, the front and/or rear circuit boards may include a processor or multiple processors that are configured to perform optimally at a temperatures above −40 degrees Celsius. In another example, the front and/or rear circuit boards may include components that are configured to perform optimally at a temperature above −30 degrees Celsius. Likewise, the front circuit board 34 and the rear circuit board may contain components that are configured to perform optimally below a certain temperature. For example, the components on the front or rear circuit board may perform optimally below a temperature of 55 degrees Celsius. In another example, the components may perform optimally at temperature below 60 degrees Celsius.

The image sensor 25 and/or the image sensor circuit board 24 and/or any mechanism associated with moving the front lens element 28 and/or rear lens element may also be configured to perform optimally within a specific temperature range. For example, image sensor 25, may output a signal with increased noise when a temperature increases above 50 degrees Celsius and may further provide an increasingly noisy signal when temperature increase to over 60 degrees Celsius. In addition, the image sensor 25 and or image sensor circuit board 24 may decrease in performance at temperatures below −30 degrees Celsius or −40 degrees Celsius.

In the past, providing camera systems capable of performing in a satisfactory manner above and below the operating temperature ranges of conventional internal components of the camera required either providing components that have a wider operating temperature range, at an increased cost and/or providing a heating and/or cooling system, which required an increase in energy consumed by the camera system. The system of the current disclosure provides a dynamic system to control thermal conduction between the outer housing walls and the internal components of the camera system. One implementation of a thermal conduction management system in accordance with an aspect of the disclosure may include a thermal bridge assembly for selectively increasing or decreasing the thermal conductivity between the outer housing walls (e.g., outer housing walls, 10, 40, 41 and/or 42) and the first bracket 21 and/or second bracket 32. By selectively increasing or decreasing the thermal conductivity between the outer housing walls and the inner brackets, the internal temperature and/or environment (e.g., humidity) of the camera system 50 may be controlled.

Figure 2:
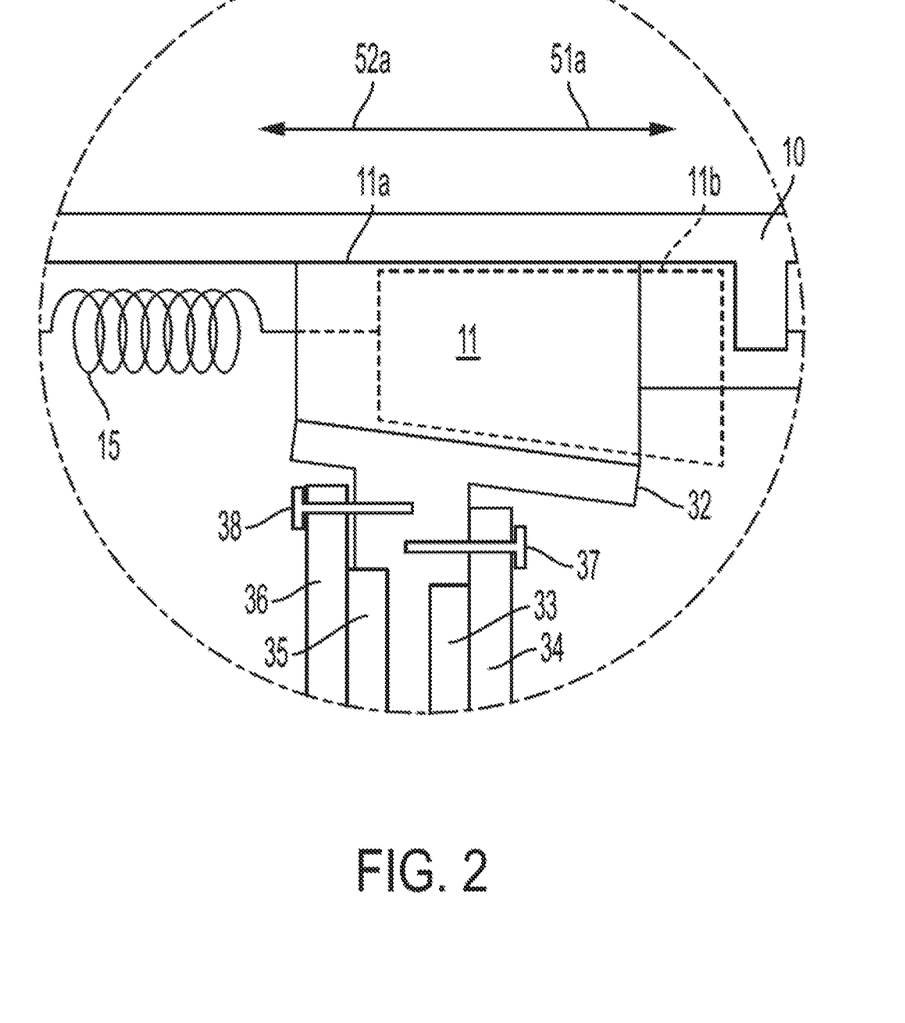
FIG. 2 is a magnified view of a portion of FIG. 1 showing the temperature regulating camera housing and camera in first and second states of operation according to the described aspects of the present disclosure.

One example of a thermal bridge assembly is shown in FIGS. 1 and 2. The thermal bridge assembly may comprise a single or a series of bridge members (e.g., references 11, 12, 13, and 14). The bridge members 11, 12, 13, and 14 may be slidably contained within the housing and may be configured to move in a first direction (e.g., direction 51a), which may hereinafter be interchangeably be referred to as movement into the first position, so that the bridge members 11, 12, 13, and 14 are not in contact with the outer housing walls 10 and 40 and/or the first bracket 21 and second bracket 32, thus preventing a thermal bridge between the outer housing walls 10 and 40 of the camera 50 and the first bracket 21 and second bracket 32 and causing a decrease in thermal conduction therebetween. One example of the aforementioned movement into the first direction is shown in FIG. 2 as position 11b. Preventing a thermal bridge between the outer housing walls 10 and 50 and the first and second brackets 21 and 32 by moving the bridge member 11 in the first direction 51a may for example be advantageous if the temperature outside of camera housing is greater than the temperature within the camera housing in order to prevent the interior of the housing and/or the second bracket from increasing in temperature and/or to allow the heat generated by the camera components within the housing to decrease humidity within the housing. Further, preventing a thermal bridge between the outer housing walls 10 and 40 and the first and second brackets 21 and 32 via the bridge members 11, 12, 13, and 14 may be advantageous if a temperature outside the camera housing is at or lower than a temperature that may affect performance of and/or damage the camera components within the housing.

Further, the bridge members 11, 12, 13, and 14 may be configured to move in a second direction (e.g., direction 52a), which may hereinafter be interchangeably referred to as movement into the second position, to bridge a gap between brackets 21 and 32 and outer housing walls 40 and 10 of the camera housing. One example of the aforementioned second position is shown in FIG. 2 as position 11a. For example, bridge members 11, 12, 13, and 14 may be configured to move in a first direction (e.g., direction 52a) until the bridge members 11, 12, 13, and 14 contact both an inner surface of outer housing walls 10 and 40 of the camera housing and a surface of the first bracket 21 and the second bracket 32. Thus, the bridge members 11, 12, 13, and 14, may increase thermal conduction between the outer housing walls 10 and 40, which may be exposed to an external environment. Causing a thermal bridge between the outer housing walls 10 and 50 and the first and second brackets 21 and 32 may for example be advantageous if the temperature outside of camera housing is lower than the temperature within the camera housing or once an internal temperature of the camera housing increases beyond an acceptable threshold in order allow heat to dissipate from the housing via thermal conduction.

It is noted that while the aforementioned examples discuss all of the bridge members being moved simultaneously, any one or a combination of the bridge members 11, 12, 13, and 14 may be individually moved to regulate the temperature of the first bracket 21 and/or second bracket 32 and/or the outer housing walls of the camera 50.

In the example shown in FIG. 1, all of the bridge members 11, 12, 13, and 14 may be similar. Thus in the following description, example implementations will be discussed with reference to the first bridge member 11. However, it is to be understood that any one of or all of the features described throughout this disclosure are applicable to any single one of or any combination of the bridge members 11, 12, 13, and 14.

In one example, the bridge member 11 may have an angled surface configured to contact a respective angled surface of the second bracket 32. The bridge member 11, may be formed of any metallic material, but may preferably be formed of a material with a high thermal conductivity (e.g., copper or silver). The bridge member 11 may be connected at a first end to a biasing member 15 configured to provide a biasing force to the bridge member. In one example, the biasing member 15 may for example be a coil spring which provides a force to the bridge member 11 in a first direction 51*a* or a torsion spring that provides a force to the bridge member 11 in the second direction 52*a*. In either of the aforementioned examples, the biasing member 15 may be configured to provide a resistive force to a force applied by a single or multiple translating mechanisms 19 and 49. The bridge member 11 may be connected directly or indirectly at a second end to the translating mechanism 19. The translating mechanism 19 may be configured to selectively provide a force (e.g., in first direction 51*a* if a torsion spring is used or in the second direction 52*a* if a coil spring is used), in response to a temperature and/or other environmental change (e.g., humidity) either within the camera housing and/or a temperature and/or environmental change in the environment outside the camera housing.

In the examples above, the translating mechanism 19 may include any appropriate mechanism for moving the bridge member 11 into contact with comprise a shape-memory alloy, shape-memory alloy based linear actuator, bimetallic strip or coil, and/or a linear actuator such as an electric solenoid or motor, a pneumatic actuator, or a hydraulic actuator to name a few examples.

In one example, implementation the translating mechanism 19 may include a shape-memory alloy ("SMA") and/or SMA based actuator. The SMA or SMA based actuator may include or be based on the principle that an SMA can be deformed when cold but returns to its pre-deformed or remembered shape when heated or vice-versa. SMAs may for example comprise copper-aluminum-nickel (Cu—Al—Ni) and nickel-titanium (NiTi) or by alloying zinc, copper, gold and/or iron. Iron-based and copper-based SMAs, may for example comprise Fe—Mn—Si, Cu—Zn—Al and Cu—Al—Ni to include a few additional examples. The shape memory effect in an SMA may occur because a temperature-induced phase transformation reverses deformation of the material. The SMA or SMA based actuator may be designed to change shape and/or provide a force in the first direction (e.g., direction 51*a*) and/or a second direction (e.g., direction 52*a*) when a selected temperature or temperature range is reached causing the first bridge member 11 to move from a position in contact with outer housing wall 10 and second bracket 32 and/or a position out of contact with the housing 20 and/or second bracket 32. The use of SMAs to move the bridging members (e.g., references 11, 12, 13, and 14) may provide a lightweight, simplified solid-state alternative to actuators such as hydraulic, pneumatic, and motor-based systems. The aforementioned SMAs may be activated solely by a change in physical properties within the SMA due to a temperature change, and/or the SMAs may be activated via control system (e.g., a processor and/or controller, which may be mounted to the first bracket 21 and/or second bracket 32. One example of such an SMA based actuator system usable with the current disclosure is produced by Autosplice of San Diego Calif. However, as another example implementation, the bridging members (e.g., references 11, 12, 13, and 14) may also be moved as described above using any known hydraulic, pneumatic, electric and motor-based as well. In the example systems using a SMA based actuator, hydraulic, pneumatic, electric, and/or motor based system, a suitable controller and/or processor or system for moving the translating mechanism and a single and/or multiple temperature and/or humidity detectors configured to provide a signal to the controller and/or system may be implemented. In one example, the aforementioned control system and/or processor may be any such system known in the art. The aforementioned controller and/or control system may be mounted to the first bracket 21 and/or second bracket 32, for example. In another aspect, the aforementioned biasing members 15-18 may be replaced by SMAs and replace the translating mechanism 19 and 49 (while maintaining the example functions described herein) and/or may be configured to work in conjunction with translating mechanisms 19 and 49.

In another example implementation, the translating mechanism 19 may comprise a bimetallic strip, coil, or member. The bimetallic strip, coil, or member may consist of two or more strips of deferent materials which expand at different rates as they are heated due to differences in coefficient of thermal expansion of the materials. The aforementioned two or more materials may be fixed together causing a change in overall shape when the bimetallic strip, coil, or member is subject to temperature fluctuations. For example, a bimetallic strip or member with a first material having a higher coefficient of thermal expansion than the second material would curve away from the material with the higher coefficient of thermal expansion when the temperature of the bimetallic strip or member increases. By varying the materials and layers, a bimetallic strip, coil, or member may be designed so that a specific temperature or temperature range causes curvature or other deformation of the bimetallic strip, coil or member. Some examples of materials usable in a bimetallic may include and are not limited to steel and steel alloys, copper, and/or brass. The bimetallic may for example be operatively connected to the first bridge member 21 and may be designed to change shape and/or provide a force in the first direction (e.g., direction 51*a*) and/or a second direction (e.g., direction 52*a*) when a selected temperature or temperature range is reached causing the first bridge member 11 to move from a position in contact with the outer housing wall 10, and thus allowing thermal conduction therebetween, and second bracket 32 and/or a position out of contact with the housing 20 and/or second bracket 32, and thus preventing thermal conduction therebetween. In another aspect, the aforementioned biasing members 15-18 may be replaced with a bimetallic strip, coil, or member, and replace the translating mechanism 19 and 49 (while maintaining the example functions described herein) and/or may be configured to work in conjunction with translating mechanisms 19 and 49. In any one of the aforementioned aspects, the translating mechanisms 19 and 49 may be cables that are connected to the first bridge member 11 and a second bridge member 13. The cables may run though the third bridge members 12 and fourth bridge member 14 and may include a first collar 22 and second collar 31 for preventing the third bridge member 13 and the third bridge member 12 from sliding with relation to the cables.

As one non-limiting example implementation of the aforementioned examples, the translating mechanisms 19 and 49 may be configured to dynamically move the bridge members 11, 12, 13 and 14 based on the optimal temperatures of the components within the camera 50. For example, the image sensor 25, image sensor circuit board 24 and/or front and/or rear circuit boards 34 and 36 may include components that are configured to perform optimally at a temperature range within −40 degrees Celsius and 50 degrees Celsius. Thus, the bridge members 11, 12, 13, and 14 may be moved in the first directions 51a-d so as to not create a thermal bridge between the outer housing walls 10 and 40 if the temperature outside the camera housing is such that the temperature within the housing could approach −40 degrees Celsius. In another example, the bridge members 11, 12, 13, and 14 may be moved in in the first directions 51a-d so as to not create a thermal bridge between the outer housing walls and the inner brackets if the temperature outside the camera housing is above 55 degrees Celsius and the temperature inside the housing is less than the temperature outside the camera housing.

Conversely, the bridge members 11, 12, 13, and 14 may be moved in the second directions 52a-d so as to create a thermal bridge between camera housing and the first and second brackets 21 and 32 if the temperature within camera housing could approach 55 degrees Celsius, thus allowing heat to dissipate from the outer surface of the camera 50. In another example, the bridge members 11, 12, 13, and 14 may be moved in the second direction 52a-d so as to create a thermal bridge between the outer housing walls 10 and 40 and the first and second brackets 21 and 32 if the within the camera housing could exceed 55 degrees Celsius.

Figure 3:
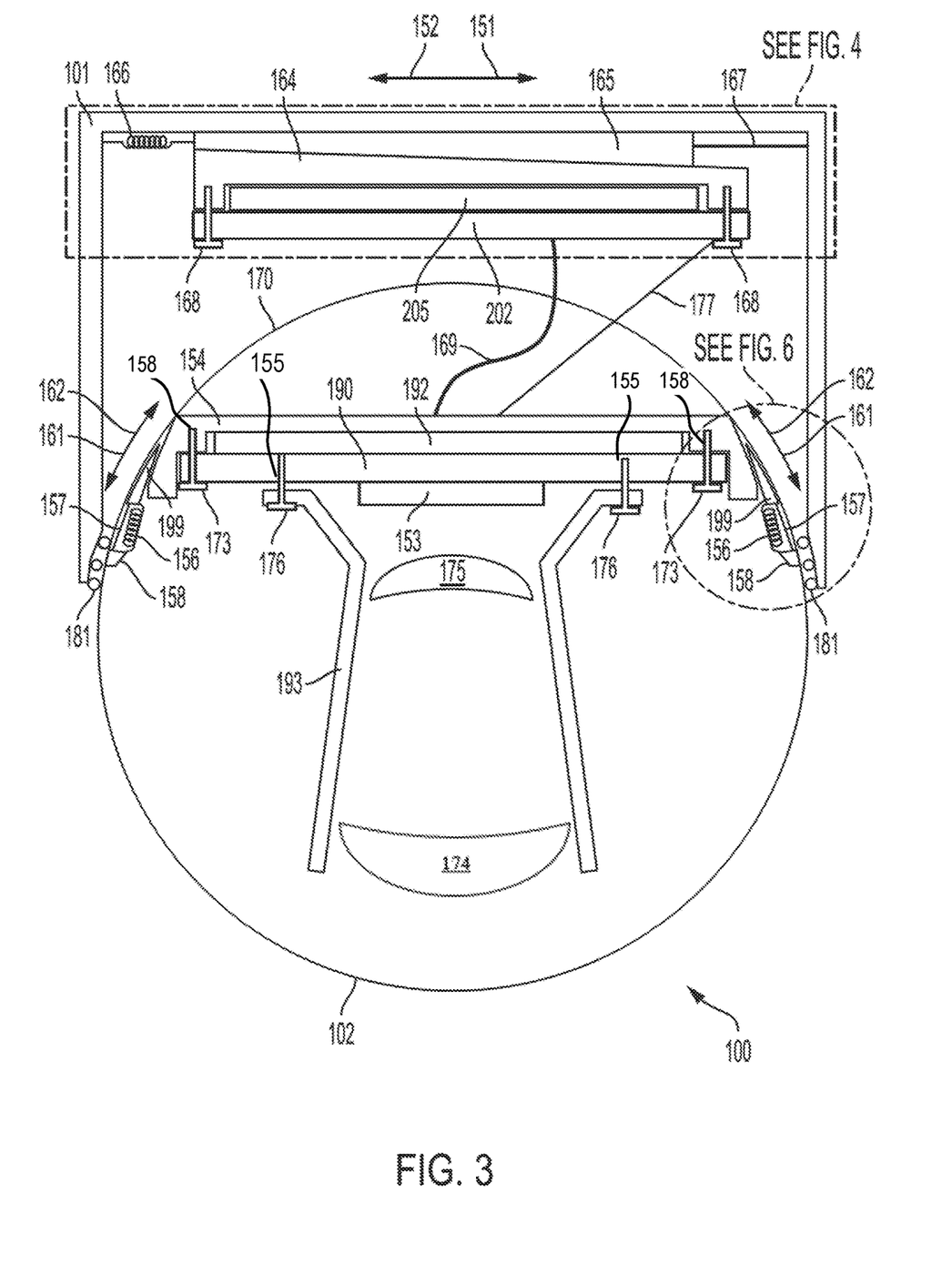
FIG. 3 is a diagram of another example top view a temperature regulating camera housing and camera, according to the described aspects of the present disclosure.

FIG. 3 shows a second example implementation of the current disclosure. an example camera system and housing is shown. The camera system 100 may include outer housing walls 101 and a movable dome 170. The movable dome 170 may be motorized and configured to rotate with relation to the outer housing walls 101 to adjust the field of view of the camera system. The system implemented for movement of the movable dome 170 may be any known system in the art. In one example, the outer housing walls 101 may be comprised of a metallic material such as steel or aluminum. The moveable dome 170 may for example be comprised of or partially comprised of a transparent or semi-transparent material such as polycarbonate, Poly(methyl methacrylate), acrylic, acrylic glass, and/or glass. In one example, the movable dome may for example be comprised of a metallic material such as steel or aluminum and may have a window or transparent portion 102 formed of any one of the aforementioned materials, to name a few examples. The housing 101 and/or dome 170 may be configured to be air and/or water tight. In one example, the dome 170 and the housing 101 may have seals 181 therebetween to prevent environmental ingress into the housing 101 and dome 170. The housing 101 and/or dome 170 may additionally be configured to be opened by a technician or user to allow for servicing and/or replacement of the components therein.

The aforementioned outer housing walls 101 and/or dome may be configured to contain necessary optics, image sensor(s) and/or circuitry for recording still images and/or video. For example, the outer housing walls 101 may contain an image sensor 153, which may be coupled with, connected to or mounted on image sensor circuit board 190. The image sensor circuit board 190 and/or image sensor 153 may be mounted to a dome bracket 154. The dome bracket 154 may include mounting portions for receiving the image sensor circuit board 190 and/or the image sensor circuit board mounting provisions 173 In one example, the mounting provisions 173 may be a threaded fastener or series of fasteners 173 configured to be threaded into respective threaded openings 158 in the dome bracket 154. The dome bracket 154 may be stationarily mounted with relation to the dome 170. The image sensor circuit board 190 and/or dome bracket 154 may also have optics mounted thereto, which may include a lens mount 193, a front lens element 174 and rear lens element 175. In one example, the lens mount 193 may be mounted to the dome bracket 154 via the aforementioned mounting provisions 173. In another example, the image sensor circuit board 190 may include threaded openings 155 for receiving fasteners 176 to mount the lens mount 193 thereto. The lens mount 193 may further include a mechanism (not shown) for increasing or decreasing the focal length by moving either on of or both of the front lens elements 174 to the rear lens element 175. Such mechanisms are known and commonly used in the art and thus further detail of such a mechanism is not provided here. In addition, the image sensor circuit board 190 may have a thermal conduction foam backing 192, that may be any material that enhances the thermal conductivity between image sensor circuit board 190 and the dome bracket 154.

The camera system 100, may further include a housing bracket 164. The housing bracket 164 may be configured to have circuitry or circuit boards mounted thereto. For example, the housing bracket may have a first circuit board 202 and may have a thermal foam backing 205 for increasing the thermal conductivity between the first circuit board 202 and the housing bracket 164. The first circuit board 202 may be in signal communication with the image sensor 153 and/or image sensor circuit board 190, e.g., via a ribbon cable 177, and contain circuitry for acquiring images and and/or video data from image sensor 153. In one example, the first circuit board 202 may contain power supply components, e.g., an AC to DC converter, a DC to DC converter and/or a control unit and/or a processor or multiple processors, to name a few examples. However, either one of or both of the image sensor circuit board 190 and/or the first circuit board 202 may contain any components or features known in the art that may be necessary for operation of a camera system.

In one example, the image sensor circuit board 190 and/or first circuit board 202 may contain circuits that are configured to perform optimally within a certain temperature range. For example, the first circuit board 202 may include a processor or multiple processors that are configured to perform optimally at a temperatures above −40 degrees Celsius. In another example, the first circuit board 202 may include components that are configured to perform optimally at a temperature above −30 degrees Fahrenheit. Likewise, the first circuit board 202 may contain components that are configured to perform optimally below a certain temperature. For example, the components on the first circuit board 202 may perform optimally below a temperature of 60 degrees Celsius. In another example, the components may perform optimally at temperature below 55 degrees Celsius.

The image sensor 153 and/or image sensor circuit board 190 and/or any mechanism associated with moving the front lens element 174 and/or rear lens element 175 may also be configured to perform optimally within a specific temperature range. For example, image sensor 153, may output a signal with increased noise when a temperature increases above 150 degrees Fahrenheit and may further provide an increasingly noisy signal when temperature increase to over 50 degrees Celsius. In addition, the image sensor 153 and or image sensor circuit board 190 may decrease in performance at temperatures below −40 degrees Celsius.

Figure 4:
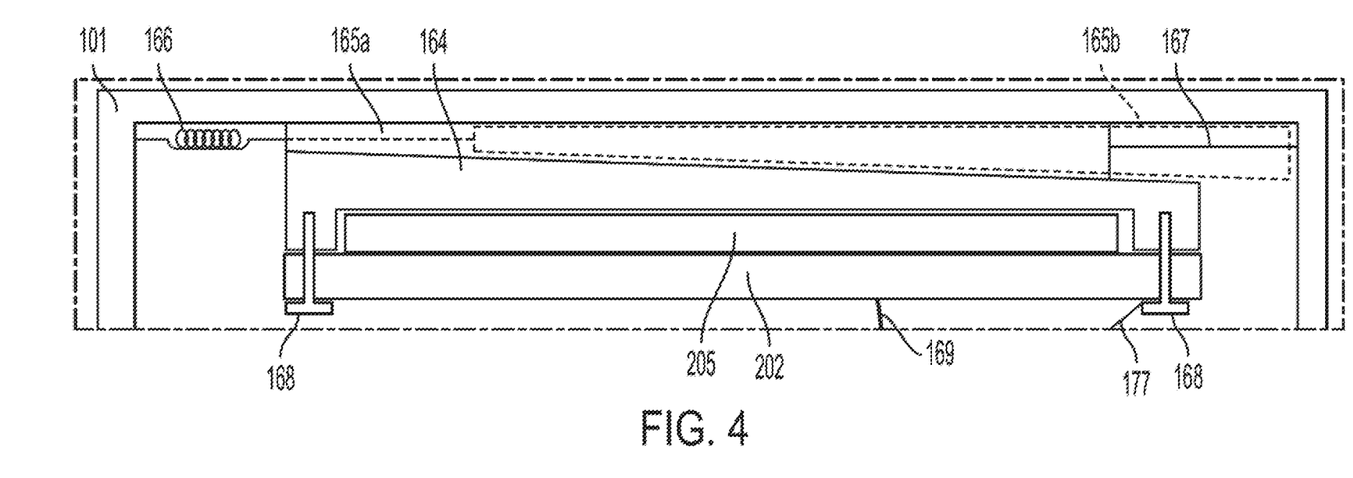
FIG. 4 is a magnified view of a first portion of FIG. 3 showing the temperature regulating camera housing and camera in first and second states of operation according to the described aspects of the present disclosure.
Figure 5:
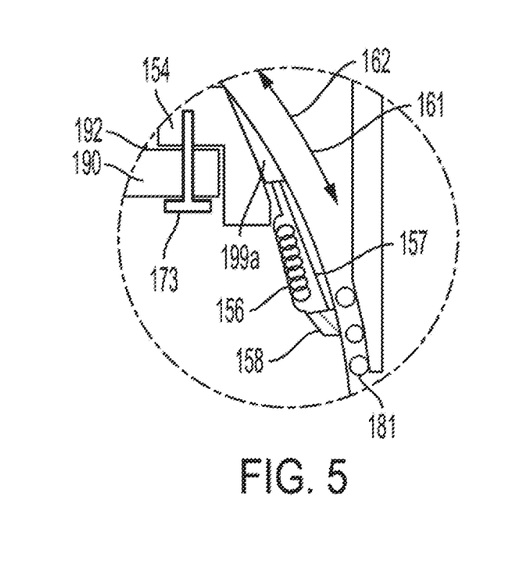
FIG. 5 is a magnified view of a second portion of FIG. 3 showing the temperature regulating camera housing and camera in a first state of operation according to the described aspects of the present disclosure.
Figure 6:
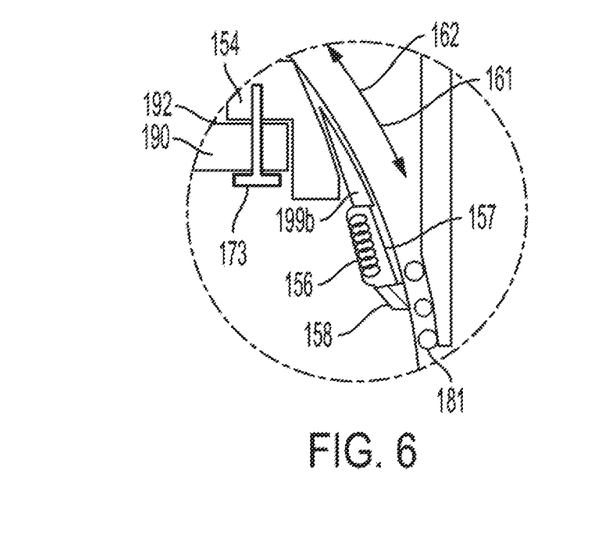
FIG. 6 is a magnified view of the second portion of FIG. 3 showing the temperature regulating camera housing and camera in a second state of operation according to the described aspects of the present disclosure.

One example of a housing thermal bridge assembly and dome thermal bridge assembly is shown in FIGS. 3, 5, and 6. The dome thermal bridge assembly may comprise a single or a series of first bridge members (e.g., references 199). The first bridge members 199 may be slidably contained within the housing and may be configured to move in a first direction (e.g., direction 161), which may hereinafter be interchangeably be referred to as movement into the first position, so that the first bridge members 199 are not in contact with the dome housing 170 and/or the dome bracket 154, thus preventing a thermal bridge between the dome housing 170 and the dome bracket 154 and causing a decrease in thermal conduction therebetween. One example of the first position is shown in FIG. 6. The housing thermal bridge assembly may comprise a single or a series of second bridge members (e.g., reference 165). The second bridge member 165 may be slidably contained within the housing 101 and may be configured to move in a first direction (e.g., direction 151), so that the second bridge member 165 is not in contact with the housing 101 and/or the housing bracket 164, thus preventing a thermal bridge between the outer housing walls 101 of the camera 100 and the housing bracket 164 and causing a decrease in thermal conduction therebetween. One example of the movement of housing thermal bridge member 165 in the aforementioned position is shown with reference 165b in FIG. 4. It is noted that the aforementioned housing thermal bridge assembly and dome thermal bridge assembly may move in the first direction or remain in the first direction in conjunction or may operate separately and independently.

Preventing a thermal bridge between the dome housing 170 and/or housing 101 and dome bracket 154 and/or by moving the first bridge members 199 in the first directions 161 and/or 151 may for example be advantageous if the temperature outside of camera housing is greater than the temperature within the camera housing in order to prevent the interior of the housing and/or the dome bracket 154 and/or housing bracket 164 from increasing in temperature and/or to allow the heat generated by the camera components within the housing to decrease humidity within the housing. Further, preventing a thermal bridge between the dome housing 170 and dome bracket 154 and/or the housing bracket 164 via first and/or second bridge members 199 and 165 may be advantageous if a temperature outside the camera housing is at or lower than a temperature that may affect performance of and/or damage the camera components within the housing.

Further, the first bridge members 199 and second bridge member 165 may be configured to move in a second directions (e.g., directions 162 and 152), which may hereinafter be interchangeably referred to as movement into the second position, either in conjunction or separately, to bridge a gap between the dome bracket 154 and/or the housing bracket 164 and the dome housing 170 and housing 165, respectively. One example of the first bridge members 199 in the second position is shown in FIG. 5. Further, an example of the second bridge member 165 in the second position is shown in solid lines as reference 165a in FIG. 4. For example, the first bridge members 199 may be configured to move in in the second direction 162 until the first bridge members 199 contact both an inner surface of dome housing 170 and a surface of the dome bracket 154. Thus, the first bridge members 199 may increase thermal conduction between the dome housing 170 and dome bracket 154, which may be exposed to an external environment. Similarly, the second bridge member 165 may be may be configured to move in a second direction 152, so that the second bridge member 165 comes into contact with the housing 101, thus causing a thermal bridge between the housing 101 of the camera 100 and the housing bracket 164 and causing an increase in thermal conduction therebetween.

Causing a thermal bridge between the dome housing 170 and/or housing 101 and dome bracket 154 and/or by moving the first bridge members 199 in the second directions 162 and/or 152 may for example be advantageous may for example be advantageous if the temperature outside of camera housing is lower than the temperature within the camera housing or once an internal temperature of the camera housing increases beyond an acceptable threshold in order allow heat to dissipate from the housing via thermal conduction.

In one example, the first bridge members 199 may include two or more bridge members on opposing sides of the dome housing 170 and/or dome bracket 154. The first bridge members 199 have an angled and/or curved surface configured to contact a respective angled surface of the dome housing 170. The first bridge members 199, may be formed of any metallic material, but may preferably be formed of a material with a high thermal conductivity (e.g., copper or silver). Similarly to the structure discussed with relation to FIG. 1 above, the first bridge members 199 may be connected at a first end to a biasing member 156 configured to bias the first bridge member 199 in a desired direction to oppose the force supplied by translating mechanisms 157. In one example, the biasing members 156 may for example be coil springs providing a force to the first bridge members 199 in second direction 162 or torsion springs that provide a force to the first bridge members 199 in the first direction 161. In either of the aforementioned examples, the biasing members 156 may be configured to provide a resistive force to a force applied by a single or multiple translating mechanisms 157. The bridge members 199 may be connected directly or indirectly at the first or at a second end to the translating mechanism 157. The translating mechanism 157 may be configured to selectively provide a force (e.g., in second direction 162 if a torsion spring is used or in the first direction 161 if a coil spring is used), in response to a temperature and/or other environmental change (e.g., humidity) either within the camera housing, e.g., when the external temperature and/or heat emitted from the internal components of the camera cause an increase in temperature, or when the temperature inside the camera housing decreases due to loss of heat to the external environment, and/or a temperature and/or environmental change in the environment outside the camera housing.

Similarly, the second bridge member 165 may include one or more bridge members. The second bridge member 165 may have an angled surface configured to contact a respective angled surface of the housing bracket 164. Similarly to the structure discussed with relation to FIG. 1 above, the second bridge members may be connected at a first end to a biasing member 166 configured to bias the second bridge member 165 in a desired direction to oppose the force supplied by a translating mechanism 167. In one example, the biasing member 166 may for example be a coil spring or multiple coil springs providing a force to the second bridge member 165 in a first direction 151 or a torsion spring or torsion springs that provide a force to the second bridge member 165 in the second direction 152. In either of the aforementioned examples, the biasing member 166 may be configured to provide a resistive force to a force applied by a single or multiple translating mechanisms 167. The second bridge member 165 may be connected directly or indirectly at the first or at a second end to the translating mechanism 167. The translating mechanism 167 may be configured to selectively provide a force (e.g., in first direction 151 if a torsion spring is used or in the second direction 152 if a coil spring is used), in response to a temperature and/or other environmental change (e.g., humidity) either within the camera housing and/or a temperature and/or environmental change in the environment outside the camera housing.

As one non-limiting example implementation of the aforementioned examples, the image sensor 153, image sensor circuit board 190 and/or circuit board 202 include components that are configured to perform optimally at a temperature range within −40 degrees Celsius and 50 degrees Celsius. Thus, the first and/or second bridge members 199 and 165 may be moved in the first directions 161 and/or 151 so as to not create a thermal bridge between the dome housing 170 and/or housing 101 if the temperature outside the camera housing is such that the temperature within the housing could approach −40 degrees Celsius. In another example, the first and/or second bridge members 199 and 165 may be moved in in the first directions 161 and/or 151 so as to not create a thermal bridge between the outer housing walls and the inner brackets if the temperature outside the camera housing is above 55 degrees Celsius and the temperature inside the housing is less than the temperature outside the camera housing.

Conversely, the first and/or second bridge members 199 and 165 may be moved in the second directions 162 and/or 152 so as to create a thermal bridge between the dome housing 170 and/or housing 101 if the temperature within camera housing could approach 55 degrees Celsius, thus allowing heat to dissipate from the outer surface of the camera 100. In another example, the first and/or second bridge members 199 and 165 may be moved in in the second directions 162 and/or 152 so as to create a thermal bridge between the outer housing walls and the inner brackets if the within the camera housing could exceed 55 degrees Celsius.

In the examples above, either one of or any combination of translating mechanisms 157 and/or 167 may include any of the mechanisms and structures described with relation to FIG. 1 above. For example, the appropriate mechanism for moving the first bridge members 199 and/or second bridge members 165 in the first or second direction may comprise a shape-memory alloy, shape-memory alloy based linear actuator, bimetallic strip or coil, and/or a linear actuator such as an electric solenoid or motor, a pneumatic actuator, or a hydraulic actuator to name a few examples.

The foregoing description of various aspects and examples have been presented for purposes of illustration and description. It is not intended to be exhaustive nor to limit the disclosure to the forms described. The embodiment(s) illustrated in the figures can, in some instances, be understood to be shown to scale for illustrative purposes. Numerous modifications are possible in light of the above teachings, including a combination of the abovementioned aspects. Some of those modifications have been discussed and others will be understood by those skilled in the art. It will be appreciated that various implementations of the above-disclosed and other features and functions, or alternatives or varieties thereof, may be desirably combined into many other different systems or applications. Also that various presently unforeseen or unanticipated alternatives, modifications, variations, or improvements therein may be subsequently made by those skilled in the art which are also intended to be encompassed by the following claims. The various aspects were chosen and described in order to best illustrate the principles of the present disclosure and various aspects as are suited to the particular use contemplated. The scope of the present disclosure is, of course, not limited to the examples or aspects set forth herein, but can be employed in any number of applications and equivalent devices by those of ordinary skill in the art. Rather, it is hereby intended the scope be defined by the claims appended hereto.

What is claimed is:

1. A thermal management apparatus for an equipment housing comprising:
    outer housing walls;
    an inner bracket for mounting an image sensor; and
    a thermal bridge assembly comprising a torsion spring, a bridge member and a bimetallic member wherein the bridge member is movable from a first position to a second position to selectively increase or decrease a thermal conductivity between the inner bracket and the outer housing walls, with the bimetallic member moving the bridge member from the first position to the second position and the torsion spring biasing the bridge member towards the first position.

2. The apparatus of claim 1, wherein the thermal bridge assembly increases the thermal conductivity between the inner bracket and the outer housing walls by moving the bridge member from the first position to the second position, wherein in the second position the bridge member simultaneously contacts the inner bracket and the outer housing walls and causes an increase in thermal conductivity between the inner bracket and the outer housing walls.

3. The apparatus of claim 2, wherein the bridge member is moved from the first position to the second position due to an increase in temperature of at least one of the image sensor, the inner bracket, or the outer housing walls.

4. The apparatus of claim 2, wherein the bridge member is moved from the first position to the second position due to an increase in temperature of at least one of an internal environment within the outer housing walls or an external environment external to the outer housing walls.

5. The apparatus of claim 2, wherein in thermal bridge assembly decreases the thermal conductivity between the inner bracket and the outer housing walls by moving the bridge member from the second position to the first position.

6. The apparatus of claim 5, wherein in the first position the bridge member is separated from at least one of the inner bracket or the outer housing walls.

7. The apparatus of claim 2, where the thermal bridge assembly comprises a first bridge member and a second bridge member, wherein the thermal bridge assembly is configured to move the second bridge member to selectively increase or decrease a thermal conductivity between the inner bracket and the outer housing walls.

8. A camera comprising:
    an image sensor;
    outer housing walls;
    an inner bracket for mounting the image sensor; and
    thermal bridge assembly comprising a torsion spring, a bridge member and a bimetallic member wherein the bridge member is movable from a first position to a second position to selectively increase or decrease a thermal conductivity between the inner bracket and the outer housing walls, with the bimetallic member moving the bridge member from the first position to the second position and the torsion spring biasing the bridge member towards the first position.

9. The camera of claim 8, wherein the thermal bridge assembly increases the thermal conductivity between the inner bracket and the outer housing walls by moving the bridge member from the first position to the second position, wherein in the second position the bridge member simultaneously contacts the inner bracket and the outer housing walls and increases the thermal conductivity between the inner bracket and the outer housing walls.

10. The camera of claim 9, wherein the bridge member is moved from the first position to the second position due to an increase in temperature of at least one of the image sensor, the inner bracket, or the outer housing walls.

11. The camera of claim 9, wherein the bridge member is moved from the first position to the second position due to an increase in temperature of at least one of an internal environment within the outer housing walls or an external environment external to the outer housing walls.

12. The camera of claim 9, wherein the thermal bridge assembly decreases the thermal conductivity between the inner bracket and the outer housing walls by moving the bridge member from the second position to the first position.

13. The camera of claim 12, wherein in the first position the bridge member is separated from at least one of the inner bracket or the outer housing walls.

14. The camera of claim 9, where the thermal bridge assembly comprises a first bridge member and a second bridge member, and wherein the thermal bridge assembly is configured to move the second bridge member to selectively increase or decrease a thermal conductivity between the inner bracket and the outer housing walls.

\* \* \* \* \*